US008975927B2

(12) United States Patent
Hwang et al.

(10) Patent No.: US 8,975,927 B2
(45) Date of Patent: Mar. 10, 2015

(54) GATE DRIVER

(71) Applicant: Samsung Electro-Mechanics Co., Ltd., Gyeonggi-do (KR)

(72) Inventors: Jong Tae Hwang, Gyeonggi-do (KR); Deuk Hee Park, Gyeonggi-do (KR); Sang Hyun Cha, Gyeonggi-do (KR); Chang Seok Lee, Gyeonggi-do (KR); Yun Joong Lee, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/842,163

(22) Filed: Mar. 15, 2013

(65) Prior Publication Data
US 2014/0184276 A1 Jul. 3, 2014

(30) Foreign Application Priority Data

Dec. 27, 2012 (KR) ........................ 10-2012-0155033

(51) Int. Cl.
H03B 1/00 (2006.01)
H03K 3/00 (2006.01)
H03K 17/04 (2006.01)

(52) U.S. Cl.
CPC ..................................... *H03K 17/04* (2013.01)
USPC ............................ 327/108; 327/109; 327/333

(58) Field of Classification Search
CPC .................. H03K 19/0175; H03K 19/00361; H03K 19/01721; H03K 19/01742
USPC .......................................... 327/108, 109, 333
See application file for complete search history.

(56) References Cited

U.S. PATENT DOCUMENTS

| 6,529,050 | B1 * | 3/2003 | Kuo et al. ..................... 327/112 |
| 2002/0175661 | A1 | 11/2002 | Wheeler et al. |
| 2003/0156439 | A1 | 8/2003 | Ohmichi et al. |
| 2005/0017767 | A1 * | 1/2005 | Huang et al. .................. 327/110 |

(Continued)

FOREIGN PATENT DOCUMENTS

| JP | 2007-305284 A | 11/2007 |
| JP | 2007305284 A | 11/2007 |
| KR | 10-2004-0039581 A | 5/2004 |

(Continued)

OTHER PUBLICATIONS

KR 10-2012-0155033 Office Action dated Nov. 29, 2013; 4pgs.
KR 10-2012-0155033 Notice of Allowance dated May 20, 2014; 2pgs.

*Primary Examiner* — John Poos
(74) *Attorney, Agent, or Firm* — Bracewell & Giuliani LLP; Brad Y. Chin

(57) ABSTRACT

Disclosed herein is a gate driver. The gate driver according to an exemplary embodiment of the present invention includes: a first power switch sourcing current according to voltage applied by a voltage source; a second power switch connected with the first power switch in series and sinking current according to the voltage applied by the voltage source; and a speed booster receiving a voltage pulse from the outside to output peak current so as to make a turn on/off operation of the first power switch fast. As set forth above, according to the exemplary embodiments of the present invention, it is possible to improve the driving speed of the gate driver without increasing the current of the current source by further including the speed booster configured of the plurality of MOSFETs and the capacitor.

6 Claims, 4 Drawing Sheets

(56) References Cited

U.S. PATENT DOCUMENTS

2010/0264974 A1\* 10/2010 Rien et al. .................... 327/313
2012/0229189 A1   9/2012 Larsen

FOREIGN PATENT DOCUMENTS

KR   10-2004-0047712 A   6/2004
KR   10-2012-0036749 A   4/2012

\* cited by examiner

GATE DRIVER

CROSS REFERENCE(S) TO RELATED APPLICATIONS

This application claims the benefit under 35 U.S.C. Section 119 of Korean Patent Application Serial No. 10-2012-0155033 entitled "Gate Driver" filed on Dec. 27, 2012, which is hereby incorporated by reference in its entirety into this application.

BACKGROUND OF THE INVENTION

1. Technical Field

The present invention relates to a gate driver used for a power IC, and the like, and more particularly, to a gate driver capable of improving a driving speed of a gate driver without increasing current of a current source.

2. Description of the Related Art

FIG. 1 is a diagram illustrating a structure of a gate driver according to the related art.

Referring to FIG. 1, the gate driver according to the related art is configured to include a first power switch 110, a second power switch 120, an inverter unit 130, a level shifter 140, and an amplification unit 150. The first power switch 110 is a power transistor PMOS for sourcing current and the second power switch 120 is a power transistor NMOS for sinking current.

The inverter unit 130 is to efficiently drive the second power switch 120 and the first power switch 110. In this case, current drivability of each inverter INV2 to INV9 of the inverter unit 130 may be represented by a size as follows.

INV2<INV3<NV4<INV5, INV6<INV7<INV8<INV9

Meanwhile, when withstand voltage of gates of the first power switch 110 and the second power switch 120 are smaller than power voltage VDD3, gate driving voltage is limited, such that a maximum swing of the gate voltage of the first power switch 110 is limited between VDD2 and 0V and a maximum swing of the gate voltage of the second power switch 120 is limited between VDD1 and 0V. Therefore, auxiliary power supplies VDD1 and VDD2 are required and in this configuration, a level shifter 140 configured of transistors M1 and M2 is required to drive the first power switch 110.

When input current IN from the outside is high, the M1 of the level shifter 140 is turned on and current of a current source CS connected with the level shifter 140 flows through the M1. The current is copied to a transistor M8 of an amplification unit 150, while the current the M2 is 0 and thus current of a M6 is 0. Therefore, an output from the M8 and the M6 becomes a low level. When the input current IN is low, the current of the M8 is 0, and therefore the output from the M8 and the M6 becomes a high level.

In order to rapidly turn on/off the first power switch MP, an operation of the level shifter 140 and the amplification unit 150 needs to be fasts. A speed of the amplification unit 150 is in proportion to a current quantity of the current source CS that is connected with the level shifter 140. Therefore, when the current of the current source CS is increased, a speed of the gate driver may be improved. As described above, however, there is a problem in that current is increased, and thus power consumption is increased.

RELATED ART DOCUMENT

Patent Document (Patent Document 1) JP Patent Laid-Open Publication No. 2007-305284

(Patent Document 2) US Patent Laid-Open Publication No. US 2012/0229189

SUMMARY OF THE INVENTION

An object of the present invention is to provide a gate driver capable of improving a driving speed of a gate driver without increasing current of a current source by further including a speed booster configured of a plurality of MOSFETs and a capacitor.

According to an exemplary embodiment of the present invention, there is provided a gate driver, including: a first power switch sourcing current according to voltage applied by a voltage source; a second power switch connected with the first power switch in series and sinking current according to the voltage applied by the voltage source; and a speed booster receiving a voltage pulse from the outside to output peak current so as to make a turn on/off operation of the first power switch fast.

The gate driver may further include: an inverter unit outputting a signal for driving the first and second power switches.

The gate driver may further include: a level shifter shifting a voltage level to drive the first power switch.

The level shifter may include first and second NMOSs that are a parallel connection relationship with each other.

The gate driver may further include: an amplification unit amplifying current flowing in the first power switch side so as to implement a rapid turn on/off operation of the first power switch.

The speed booster may be configured of a serial-parallel combination circuit of a plurality of MOSFETs and one capacitor.

The speed booster may be configured of a serial-parallel combination circuit of four MOSFETs and one capacitor.

The speed booster may be configured to have a structure in which four NMOSs are disposed at each of the squared vertex portions so that first and third NMOSs and second and fourth NMOSs form each a diagonal to each other, gates of the first and third NMOSs are connected with an input terminal of the level shifter, gates of the second and fourth NMOSs are connected with an output terminal of the level shifter, a source of the first NMOS and a drain of the fourth NMOS are connected with each other, a source of the second NMOS and a drain of the third NMOS are connected with each other, drains of the first and second NMOSs are each connected with drains of the first and second NMOS of the level shifter, a source of the third and fourth NMOSs are each connected with a ground, and the capacitor is installed between a first common node N1 at which the source of the first NMOS and the drain of the fourth NMOS are connected with each other and a second common node N2 at which the source of the second NMOS and the drain of the third NMOS are connected with each other.

DESCRIPTION OF THE PREFERRED EMBODIMENTS

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Throughout the specification, unless explicitly described otherwise, "comprising" any components will be understood to imply the inclusion of other components but not the exclusion of any other components. In addition, a term "part", "module", "unit", or the like, described in the specification means a unit of processing at least one function or operation and may be implemented by hardware or software or a combination of hardware and software.

Hereinafter, exemplary embodiments of the present invention will be described in detail with reference to the accompanying drawings.

Figure 1:
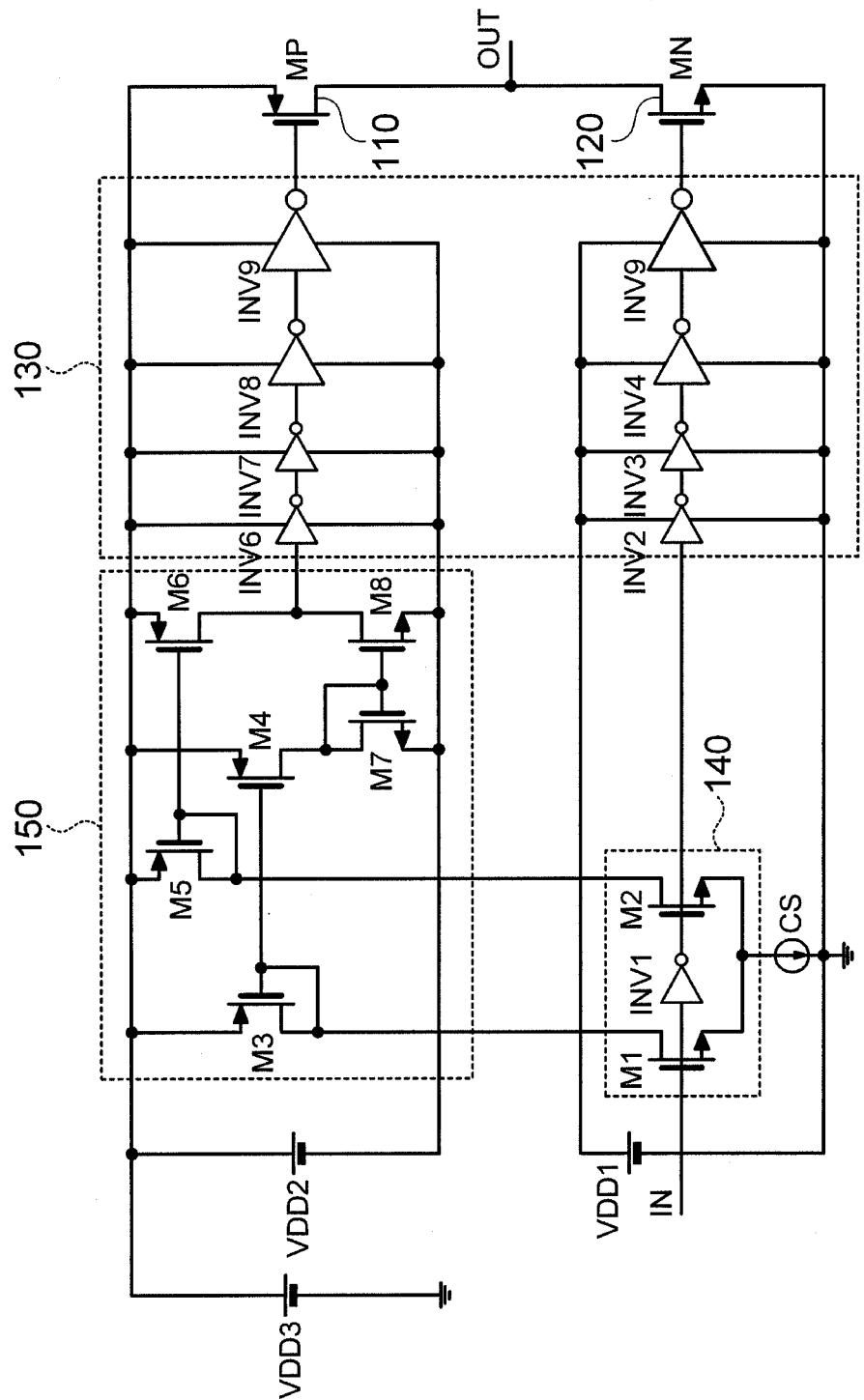
FIG. 1 is a diagram illustrating a structure of a gate driver according to the related art.
Figure 2:
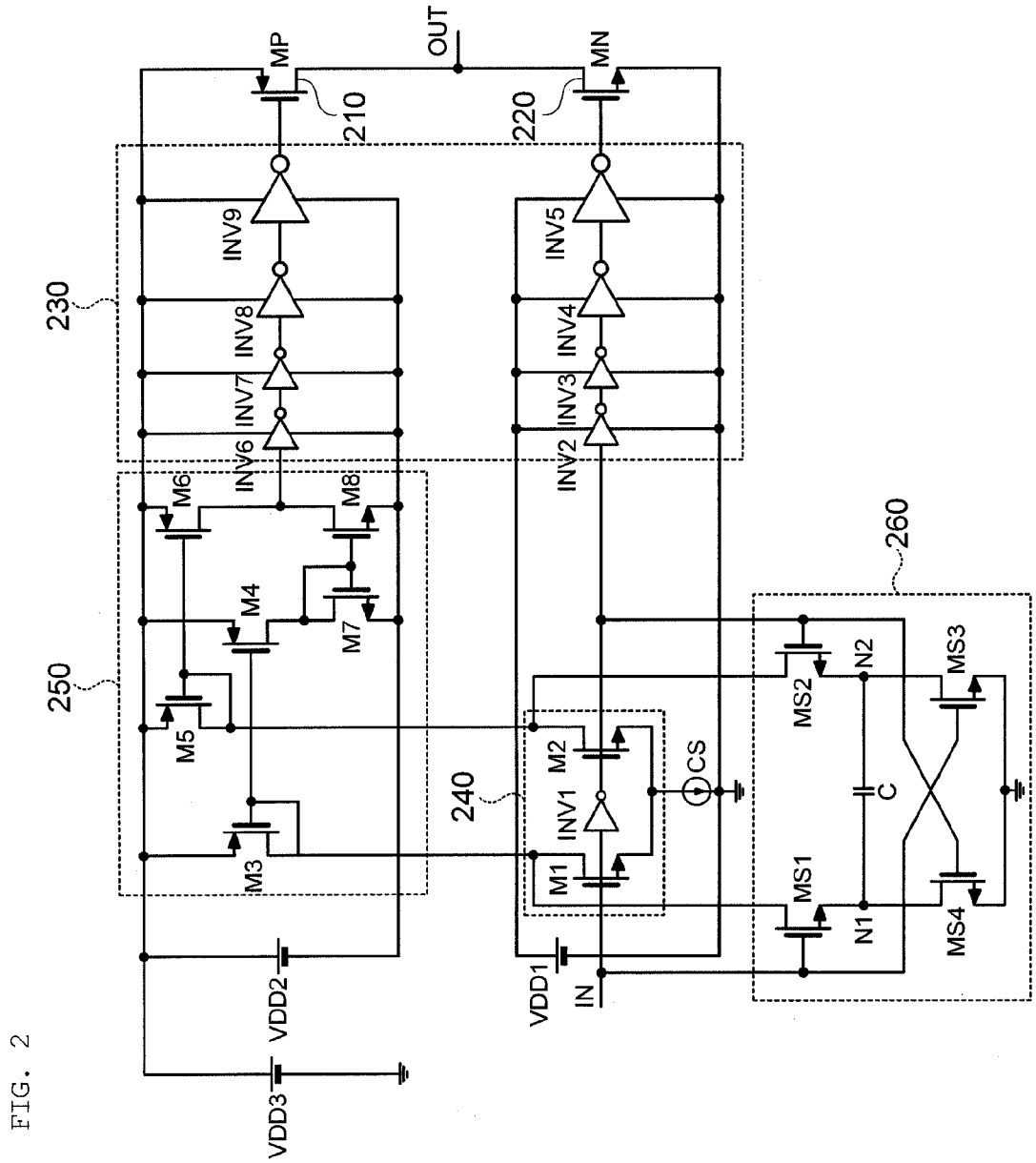
FIG. 2 is a diagram illustrating a structure of a gate driver according to an exemplary embodiment of the present invention.

FIG. 2 is a diagram illustrating a structure of a gate driver according to an exemplary embodiment of the present invention.

Referring to FIG. 2, the gate driver according to the exemplary embodiment of the present invention is configured to include a first power switch 210, a second power switch 220, and a speed booster 260.

The first power switch 210 serves to source current according to voltage applied by a voltage source. The first power switch 210 may be configured of PMOS.

The second power switch 220 is connected with the first power switch 210 in series and serves to sink current according to voltage applied by the voltage source. The second power switch 220 may be configured of NMOS.

The speed booster 260 receives a voltage pulse from the outside to output peak current, thereby making a turn on/off operation of the first power switch 210 fast.

Herein, preferably, the gate driver may further include an inverter unit 230 that outputs a signal for driving the first and second power switches 210 and 220.

Further, preferably, the gate driver may further include a level shifter 240 that shifts a voltage level into high voltage so as to drive the first power switch 210. In this case, the level shifter 240 may be configured to include first and second NMOSs M1 and M2 that has a parallel connection relationship with each other.

Further, preferably, in order to implement a fast turn on/off operation of the first power switch 210, the gate driver may further include an amplification unit 250 that amplifies current flowing in the first power switch 210 side.

Further, the speed booster 260 may be configured of a serial-parallel combination circuit of a plurality of MOSFETs and one capacitor C.

In this configuration, the speed booster 260 may be configured of a serial-parallel combination circuit of four NMOSs MS1 to MS4 and one capacitor C.

In this case, the speed booster 260 is configured to have a structure in which four NMOSs MS1 to MS4 are disposed at each of the squared vertex portions so that first and third NMOSs MS1 and MS3 and second and fourth NMOSs MS2 and MS4 are each diagonal to each other, gates of the first and third NMOSs MS1 and MS3 are connected with an input terminal of the level shifter 240, gates of the second and fourth NMOSs MS2 and MS4 are connected with an output terminal of the level shifter 240, a source of the first NMOS MS1 and a drain of the fourth NMOS MS4 are connected with each other, a source of the second NMOS MS2 and a drain of the third NMOS MS3 are connected with each other, drains of the first and second NMOSs MS1 and MS2 are each connected with drains of the first and second NMOSs MS1 and MS2 of the level shifter 240, a source of the third and fourth NMOSs MS3 and MS4 are each connected with a ground, and the capacitor C is installed between a first common node N1 at which the source of the first NMOS MS1 and the drain of the fourth NMOS MS4 are connected with each other and a second common node N2 at which the source of the second NMOS MS2 and the drain of the third NMOS MS3 are connected with each other.

Figure 3A:
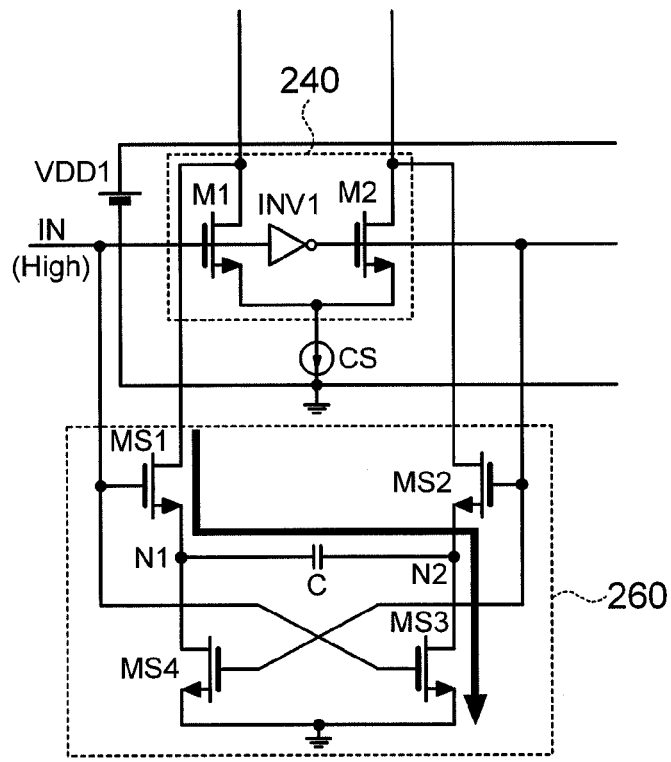
FIGS. 3A and 3B are diagrams for describing an operation of a speed booster according to a fluctuation in input current in the gate driver according to the exemplary embodiment of the present invention.
Figure 3B:
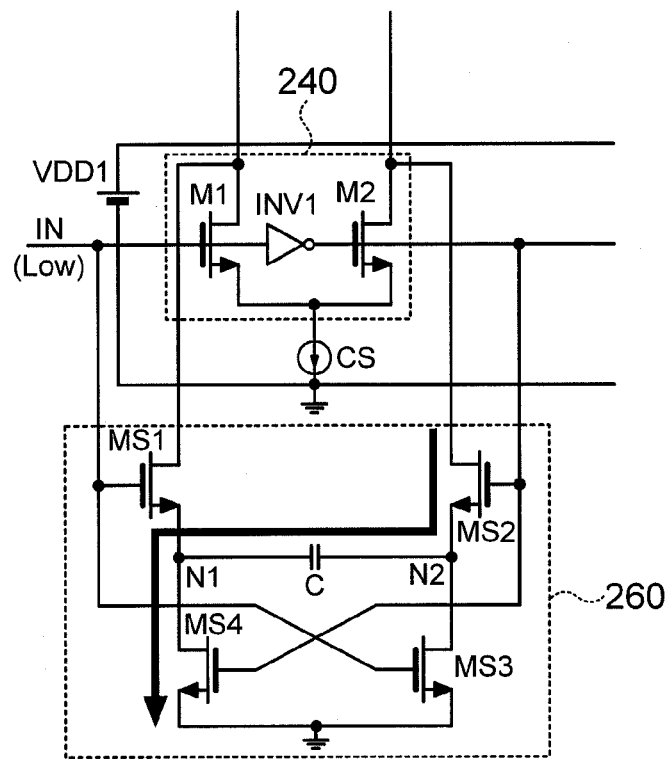

In the gate driver according to the exemplary embodiment of the present invention having the above configuration, as illustrated in FIG. 3A, when the input current IN from the outside is high, the first and third NMOSs MS1 and MS3 are turned on, and therefore charging current flows in the capacitor C as illustrated by an arrow. Further, as illustrated in FIG. 3B, when the input current IN from the outside is low, the second and fourth NMOSs MS2 and MS4 are turned on, and therefore charging current flows in the capacitor C as illustrated by an arrow.

In this case, the charging current charged in the capacitor C may be represented as follows.

$$I = C * dV/dt$$

Here, dV/dt is a voltage varying rate across a capacitor. In this case, it is substantially equal to the voltage varying rate of the input current IN.

The input current IN is a square wave and has a very large varying rate, such that even though a capacitor having small capacity is used, considerably large peak current can be obtained.

Figure 4:
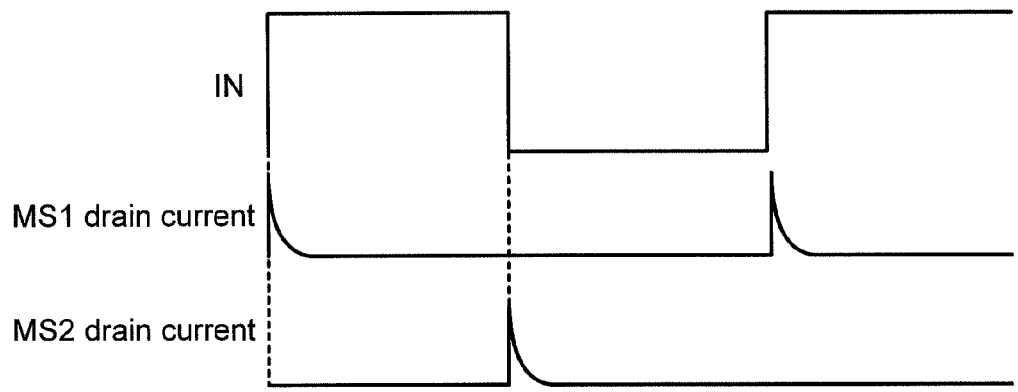
FIG. 4 is a diagram illustrating current of a first NMOS and current of a second NMOS of the speed booster, respectively, according to the fluctuation in input current in the gate driver according to the exemplary embodiment of the present invention.

As described above, the current of the first NMOS MS1 and the second NMOS MS2 according to the variation in the input current IN is as illustrated in FIG. 4.

The drains of the first NMOS MS1 and the second NMOS MS2 are each connected with the drains of the first and second NMOSs M1 and M2 of the level shifter 240, such that a large quantity of current may be supplied when the input current IN varies.

Therefore, the first power switch 210 may be driven at high speed without increasing the current of the current source CS connected with the sources of the first and second NMOSs M1 and M2 of the level shifter 240.

Figure 5:
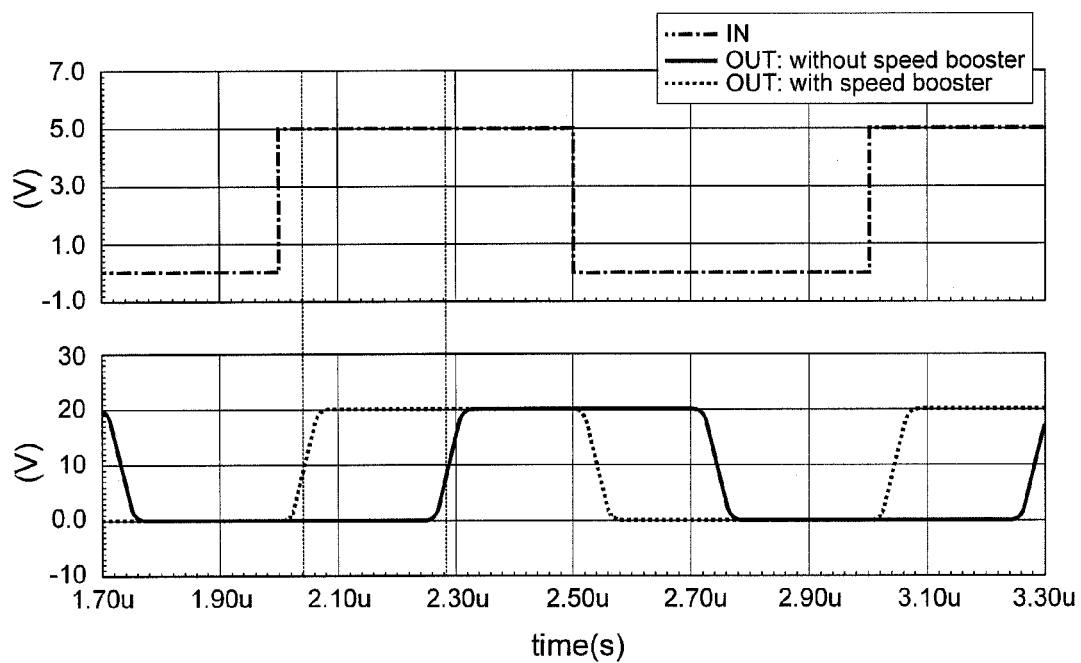
FIG. 5 is a diagram illustrating a simulation result that a load of 1 nF is connected with the capacitor and is performed.

Meanwhile, FIG. 5 is a diagram illustrating a simulation result that a load of 1 nF is connected with the capacitor and is performed.

As illustrated in FIG. 5, in the case A in which the speed booster of the exemplary embodiment of the present invention is applied, a propagation delay is 41 ns, while in the case B of a general circuit to which the speed booster is not applied, the propagation delay is 284 ns. As a result, it is possible to expect the remarkable improvement in performance by using the gate driver according to the exemplary embodiment of the present invention.

As set forth above, according to the exemplary embodiments of the present invention, it is possible to improve the driving speed of the gate driver without increasing the current of the current source by further including the speed booster configured of the plurality of MOSFETs and the capacitor.

As described above, the present invention will be described with reference to the exemplary embodiments, but is not limited thereto. It can be apparent to those skilled in the art that the exemplary embodiments of present invention can be variously changed and applied within the scope of the present invention without departing from the technical idea of the present invention. Therefore, the protection scope of the present invention must be construed by the appended claims and it should be construed that all spirits within a scope equivalent thereto are included in the appended claims of the present invention.

What is claimed is:

1. A gate driver, comprising:
   a first power switch sourcing current according to voltage applied by a voltage source;
   a second power switch connected with the first power switch in series and sinking current according to the voltage applied by the voltage source;
   a speed booster outputting peak current so as to make a turn on/off operation of the first power switch fast; and
   an amplifier amplifying current flowing in the first power switch side,
   wherein the speed booster is configured of a serial-parallel combination circuit of a plurality of MOSFETs and one capacitor.

2. The gate driver according to claim 1, further comprising:
   an inverter unit outputting a signal for driving the first and second power switches.

3. The gate driver according to claim 1, further comprising:
   a level shifter shifting a voltage level to drive the first power switch.

4. The gate driver according to claim 3, wherein the level shifter includes first and second NMOSs that are a parallel connection relationship with each other.

5. The gate driver according to claim 4, wherein the speed booster is configured of a serial-parallel combination circuit of four MOSFETs and one capacitor.

6. The gate driver according to claim 5, wherein the speed booster is configured to have a structure in which four NMOSs are disposed at each of the squared vertex portions so that first and third NMOSs and second and fourth NMOSs form each a diagonal to each other, gates of the first and third NMOSs are connected with an input terminal of the level shifter, gates of the second and fourth NMOSs are connected with an output terminal of the level shifter, a source of the first NMOS and a drain of the fourth NMOS are connected with each other, a source of the second NMOS and a drain of the third NMOS are connected With each other, drains of the first and second NMOSs are each connected with drains of the first and second NMOS of the level shifter, a source of the third and fourth NMOSs are each connected with a ground, and the capacitor is installed between a first common node N1 at which the source of the first NMOS and the drain of the fourth NMOS are connected with each other and a second common node N2 at which the source of the second NMOS and the drain of the third NMOS are connected with each other.

\* \* \* \* \*